United States Patent
Lichter

(10) Patent No.: US 6,524,917 B2
(45) Date of Patent: Feb. 25, 2003

(54) METHOD FOR FABRICATING AN INTEGRATED CIRCUIT WITH UNDERCUT ETCHING

(75) Inventor: Gerd Lichter, Radelburg (DE)

(73) Assignee: Infineon Technologies, AG, Munich (DE)

(*) Notice: Subject to any disclaimer, the term of this patent is extended or adjusted under 35 U.S.C. 154(b) by 0 days.

(21) Appl. No.: 10/158,465

(22) Filed: May 30, 2002

(65) Prior Publication Data

US 2002/0182808 A1 Dec. 5, 2002

(30) Foreign Application Priority Data

May 30, 2001 (DE) .......................... 101 26 294

(51) Int. Cl.$^7$ .......................................... H01L 21/8234
(52) U.S. Cl. ........................ 438/275; 438/619; 438/659
(58) Field of Search ............................ 438/275, 305, 438/306, 411, 619, 634, 659, 919

(56) References Cited

U.S. PATENT DOCUMENTS

| | | | |
|---|---|---|---|
| 4,124,933 A | 11/1978 | Nicholas | 438/669 |
| 5,000,818 A | * 3/1991 | Thomas et al. | 438/619 |
| 5,786,253 A | 7/1998 | Hsu | 438/275 |
| 6,054,353 A | 4/2000 | Sheu et al. | 438/275 |
| 6,127,251 A | * 10/2000 | Gardener et al. | 438/619 |
| 6,204,165 B1 | * 3/2001 | Ghoshal | 438/619 |

FOREIGN PATENT DOCUMENTS

| | | |
|---|---|---|
| DE | 199 06 291 A1 | 8/2000 |
| WO | WO 98/40909 | 9/1998 |

* cited by examiner

Primary Examiner—Chandra Chaudhari
(74) Attorney, Agent, or Firm—Jenkins & Wilson, P.A.

(57) ABSTRACT

The present invention provides a method for fabricating an integrated circuit, comprising the following steps: preparing a substrate (1) with an electrically insulating layer (2) above it; providing an interconnect (WL) having a lower conductive layer (3) and an upper conductive layer (4) on the insulating layer (2), the lower conductive layer (3) consisting of silicon of a first conduction type (n); embedding the interconnect (WL) in an electrically insulating structure (5, 8); reversing the doping of at least one first section (A1; A2) of the lower conductive layer (3) of the interconnect (WL) to the second conduction type (p); and at least partially uncovering a second section (A3) of the lower conductive layer (3) of the interconnect (WL) of the first conduction type (n); and selectively etching the second section (A3) of the lower conductive layer (3) of the interconnect (WL) of the first conduction type (n), with the first section (A1; A2) acting as an etching stop.

12 Claims, 5 Drawing Sheets

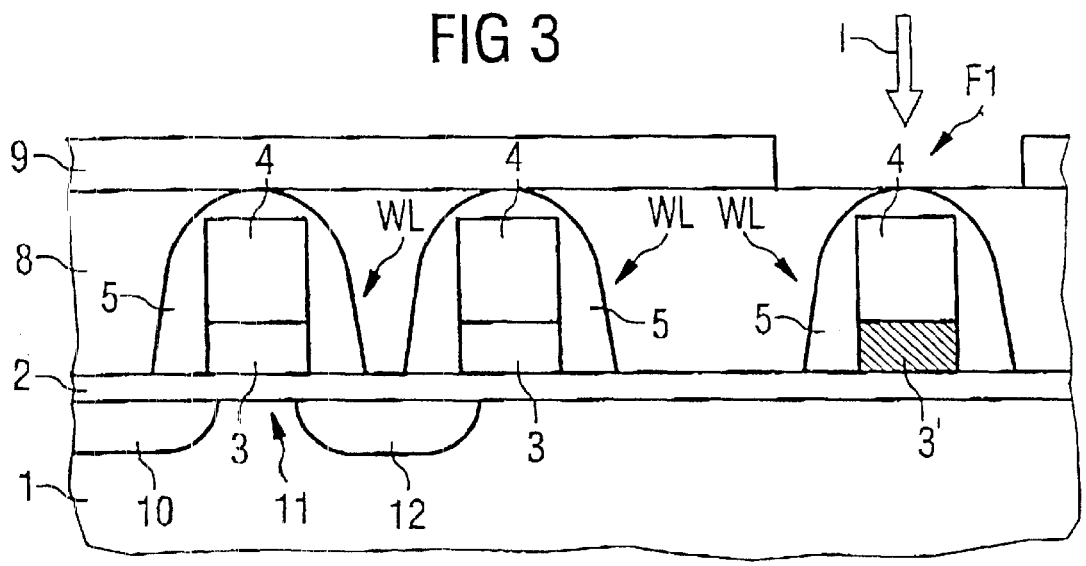
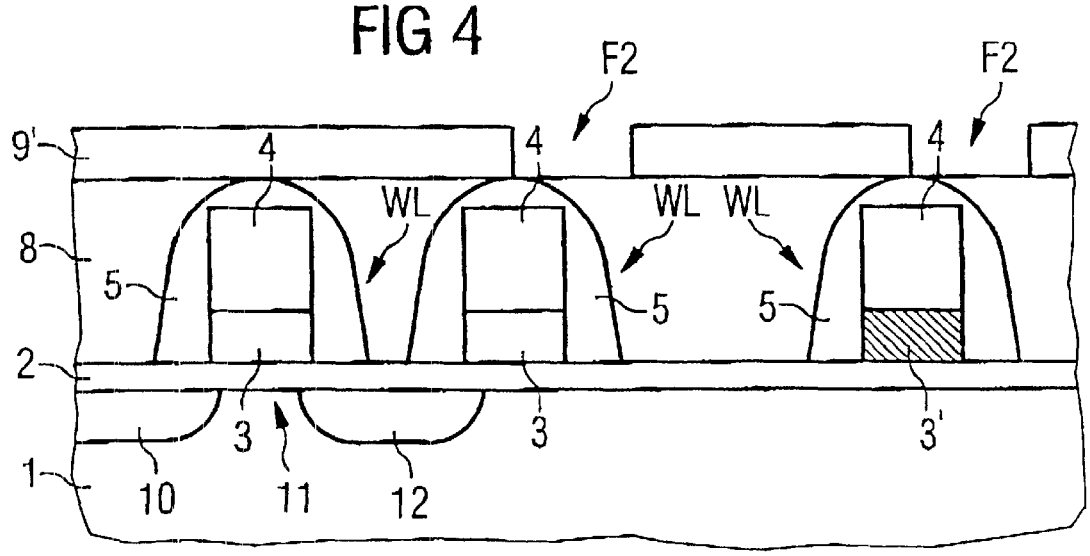

METHOD FOR FABRICATING AN INTEGRATED CIRCUIT WITH UNDERCUT ETCHING

TECHNICAL FIELD

The present invention relates to a method for fabricating an integrated circuit, comprising the following steps: preparing a substrate with an electrically insulating layer above it; providing an interconnect having a lower conductive layer and an upper conductive layer on the insulating layer, the lower conductive layer consisting of silicon of a first conduction type; embedding the interconnect in an electrically insulating structure; at least partially uncovering a second section of the lower conductive layer of the interconnect of the first conduction type and removing the second section by means of an etching process.

RELATED ART

A fabrication method of this type is known from DE 199 06 291 A1 and from U.S. Pat. No. 5,786,253.

In integrated circuits, interconnects are required as wiring to drive the individual circuit components. These interconnects usually also lead over what are known as active regions or other conductive structures, so that parasitic capacitances occur, which have an adverse effect on the speed of the circuit.

Therefore, the two documents DE 199 06 291 A1 and U.S. Pat. No. 5,786,253 have described a fabrication method in which interconnect sections are arranged above a cavity. The lower surface of the cavity adjoins an insulating layer on a substrate, while the upper surface of the cavity adjoins the interconnect and two insulating spacers which lie opposite one another. The spacers also cover the side walls of the interconnects. The cavity usually has substantially the same lateral dimensions as the interconnect and is filled with air or a substantially inert gas or is partially evacuated The fact that the size of the cavity, in particular the undercut etching of the lower layer of the interconnect, can only be controlled with difficulty has proven to be a drawback of the known fabrication method.

Therefore, it is an object of the present invention to provide a fabrication method of the type described in the introduction in which the size of the section which is removed can be controlled more accurately.

According to the invention, this object is achieved by the fabrication method which is described in claim 1.

The advantages of the method according to the invention reside in particular in the fact that the length of the undercut etching of the interconnect can be accurately set, for example by means of a masking step and an implantation step. This therefore eliminates inaccurate adjustment by means of etching time and etching temperature as in the prior art.

SUMMARY OF THE INVENTION

The idea on which the present invention is based consists in reversing the doping of at least one first section of the lower conductive layer of the interconnect to the second conduction type. This is followed by at least partial exposure of a second section of the lower conductive layer of the interconnect of the first conduction type. Finally, the second section of the lower conductive layer of the interconnect of the first conduction type is selectively etched by the etching process, with the first section acting as an etching stop.

The subclaims describe advantageous developments of and improvements to the method described in claim 1.

According to a preferred refinement, the second section of the lower conductive layer of the interconnect of the first conduction type is completely removed.

According to a further preferred refinement, the upper conductive layer consists of a metal silicide.

According to a further preferred refinement, the electrically insulating structure has spacers of the interconnect and an electrically insulating layer.

According to a further preferred refinement, the doping reversal comprises the steps of providing a first mask having an opening above the first section and carrying out ion implantation with ions of the second conduction type using the first mask.

According to a further preferred refinement, the uncovering operation comprises the steps of providing a second mask having one or more openings above the second section and removing the electrically insulating structure by means of an etching step using the second mask.

According to a further preferred refinement, the doping of two first sections, between which the second section is located, is reversed.

According to a further preferred refinement, the interconnect is a word line of a semiconductor memory device.

According to a further preferred refinement, two source/drain regions, which are spaced apart from one another, of a select transistor are provided in the substrate, and the second section runs above the channel region between these two source/drain regions.

According to a further preferred refinement, the lower conductive layer consists of polysilicon.

According to a further preferred refinement, the selective etching is carried out by wet-chemical means using KOH.

According to a further preferred refinement, the second section is filled with an electrically insulating layer.

An exemplary embodiment of the invention is illustrated in the drawings and is explained in more detail in the description which follows.

BRIEF DESCRIPTION OF THE DRAWINGS

FIGS. 1-9 show diagrammatic illustrations of successive stages of a method for fabricating an integrated circuit using silicon technology, as an embodiment of the present invention.

DETAILED DESCRIPTION OF THE INVENTION

In the figures, identical reference symbols denote components which are identical or have an identical function.

Figure 1:
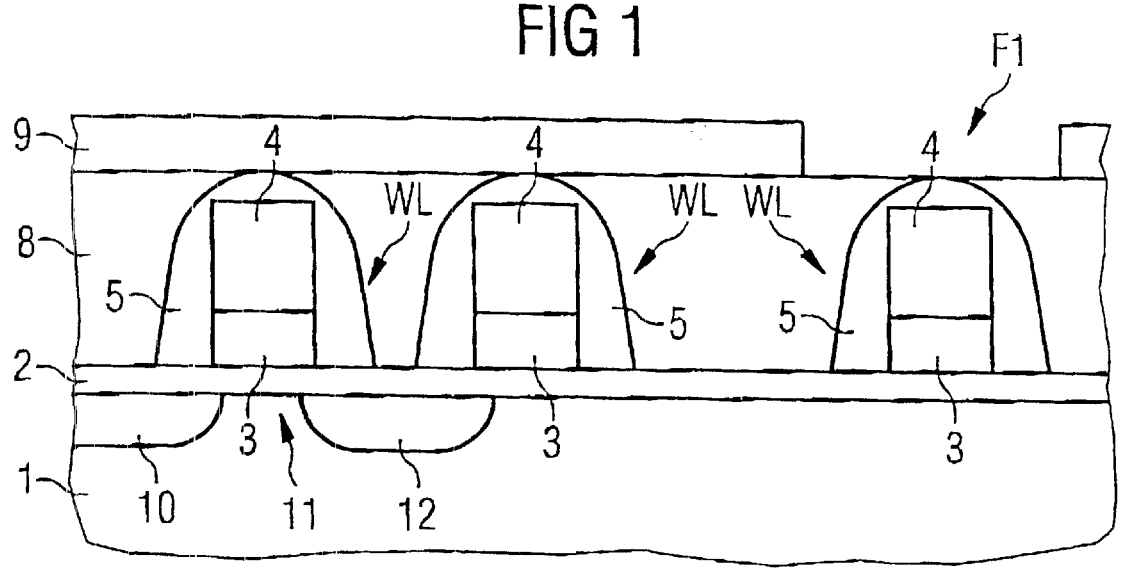

In FIG. 1, reference 1 denotes a silicon semiconductor substrate which includes a semiconductor circuit (not shown in more detail) having a number of transistors. Only a first source/drain region 10 and a second source/drain region 12, as well as a channel region 11, which is located between these source/drain regions, of a corresponding select transistor are illustrated in the substrate 1. An insulating layer 2 in the form of a gate oxide layer has been applied to the substrate 1.

Figure 2:
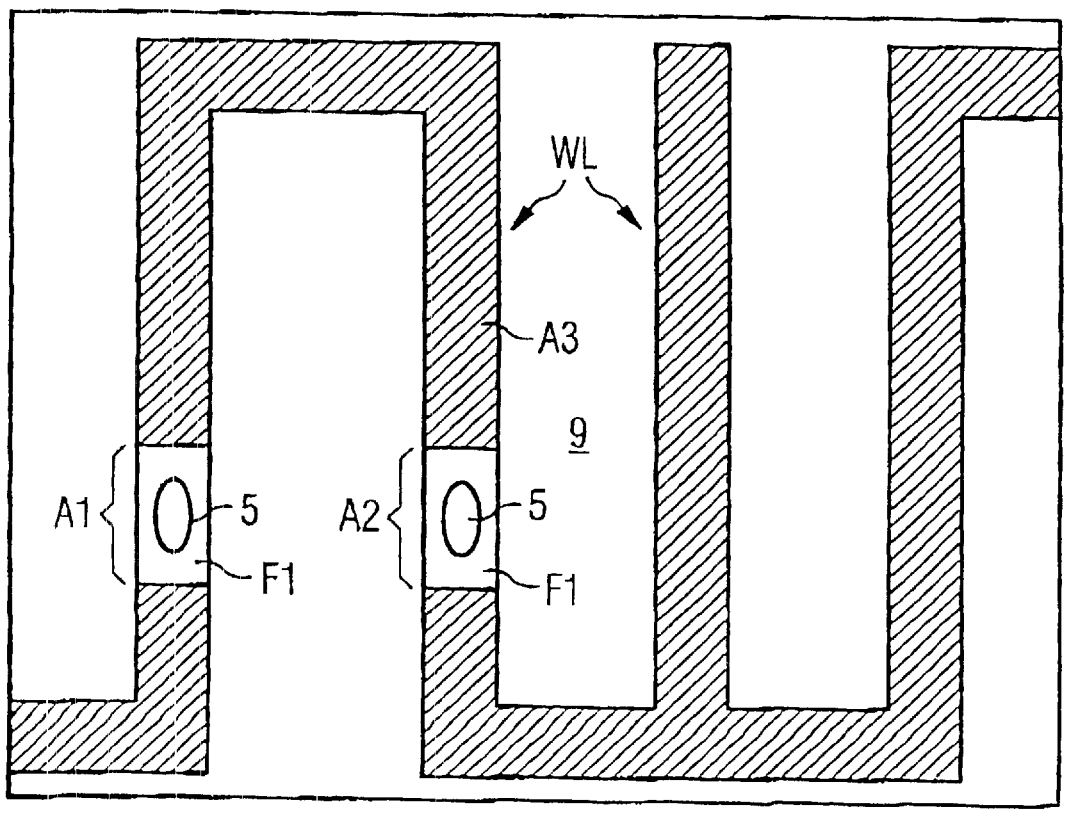

Above the gate oxide layer there is a word line WL which has a three-dimensional structure, as explained in more detail in FIG. 2. The word line has a lower conductive layer 3 comprising n-doped polysilicon, and a layer 4 of a metal silicide, in this case tungsten silicide, above it. A spacer 5 comprising silicon dioxide or silicon nitride is provided on the side faces and on the upper side of the word line WL. The spaces between the individual sections of the word line WL are filled with an insulating TEOS oxide layer 8.

As is generally known in the prior art, this TEOS oxide layer 8 is polished down all the way to the upper side of the spacers 5 by means of a chemical mechanical polishing process. A first photomask 9 is provided on the insulating TEOS oxide layer 8 and has an opening F1 which is of substantially the same width as the word line WL. Of course, if appropriate it is possible for additional antireflection coatings to be provided beneath the photoresist.

FIG. 2 shows a diagrammatic plan view (not to scale) of the structure shown in FIG. 1. In particular, FIG. 2 reveals the meandering three-dimensional structure of the word line WL below the photomask 9.

FIG. 2 also emphasizes the opening F1, which is shown in FIG. 1 and covers a section A1 of the word line WL, and a further opening F1, which covers a further section A2 of the word line. The U-shaped section A3 of the word line WL lies between the sections A1 and A2 of the word line WL.

Referring now to FIG. 3, an ion implantation step I with ions of the p conduction type takes place in a subsequent method step, the mask 9 ensuring that the implantation is restricted to the area of the window F1. The implantation leads to the doping of the lower conductive layer 3 in the right-hand section of the word line WL being reversed to form a lower conductive layer 3' of an opposite conduction type, in this case the p conduction type.

Referring once again to FIG. 2, this doping reversal therefore takes place in section A1 and in section A2 of the word line WL. By contrast, the lower conductive layer 3 in section A3 and in the other masked sections of the word line WL remains n-doped, as before.

As illustrated in FIG. 4, after the doping has been reversed by the ion implantation step I, the first mask 9 is removed and a second mask 9' comprising photoresist is applied, which second mask may, of course, also have an antireflection coating below it.

Figure 6:
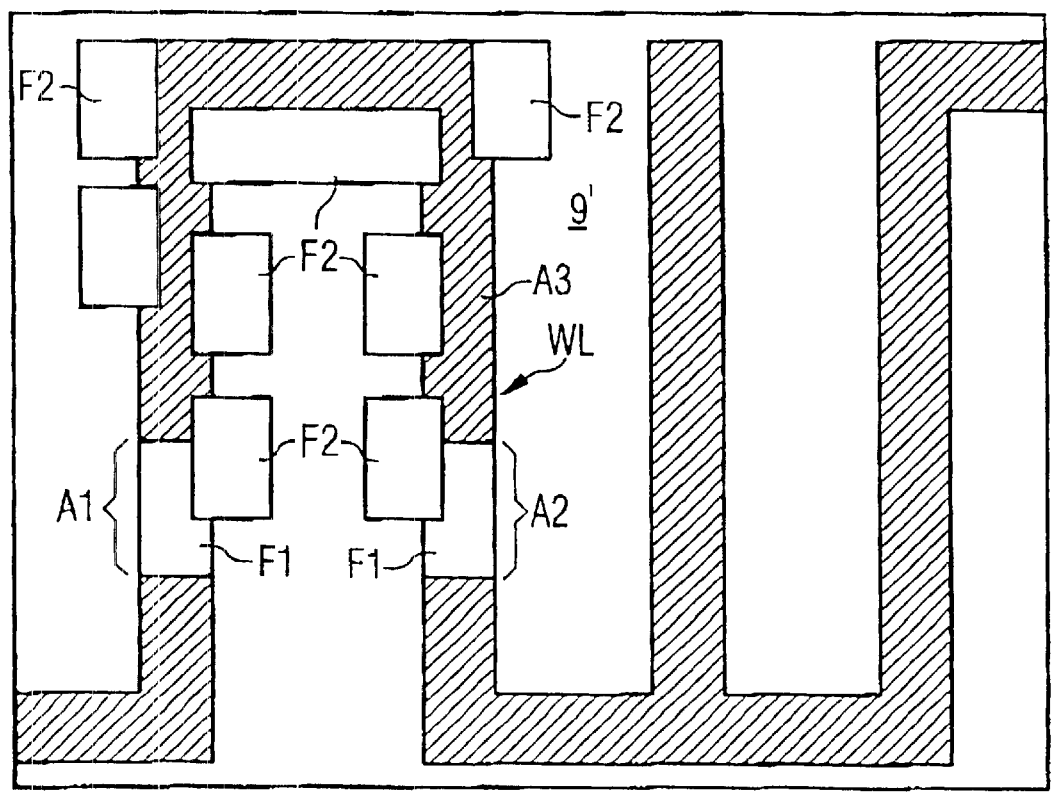

The second mask 9' has windows F2 which partially cover the section A3 of the word line WL, specifically in such a manner that the windows F2 are offset with respect to the center of the word line and cover substantially only half the lateral width and a corresponding piece of the periphery. The arrangement of the windows F2 can be seen in FIG. 6, which is an illustration corresponding to that shown in FIG. 2. It should be noted once again that FIG. 6 is purely diagrammatic and is not to scale.

Figure 5:
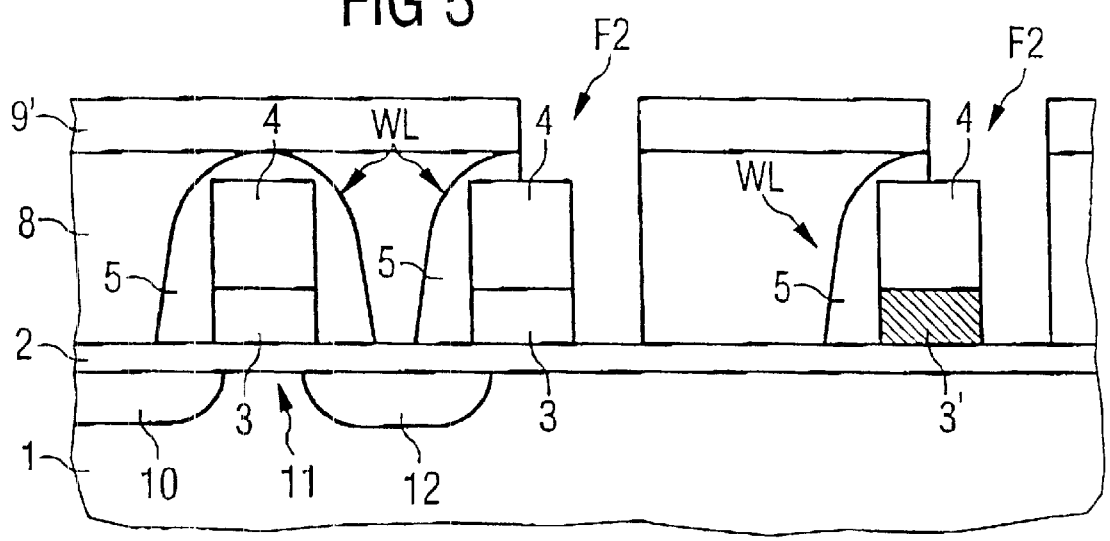

Then, as shown in FIG. 5, the second mask 9' is used for selective etching of the spacers 5 and of the insulating TEOS oxide layer 8 where the second mask 9' has the windows F2. This etching step, which is preferably a reactive ion etching step, causes part of the upper side of the conductive tungsten silicide layer 4 and a flank of the layer stack comprising the dedoped silicon 3 and the tungsten silicide layer 4 above it to be exposed at the corresponding locations. Also, in the region of reversed doping in the region of the windows F1 of the first mask 9, part of the flank of the layer stack comprising the polysilicon layer 3' whose doping has been reversed and the tungsten silicide layer 4 is uncovered.

However, this uncovering does not take place over the entire length of the area A1, but rather only over part of this length. The reason for this, as explained below, is that the first area A1 and the area A2 are intended to act as an etching stop and therefore must not be uncovered by a corresponding window F2 in the longitudinal direction of the word line WL.

Figure 7:
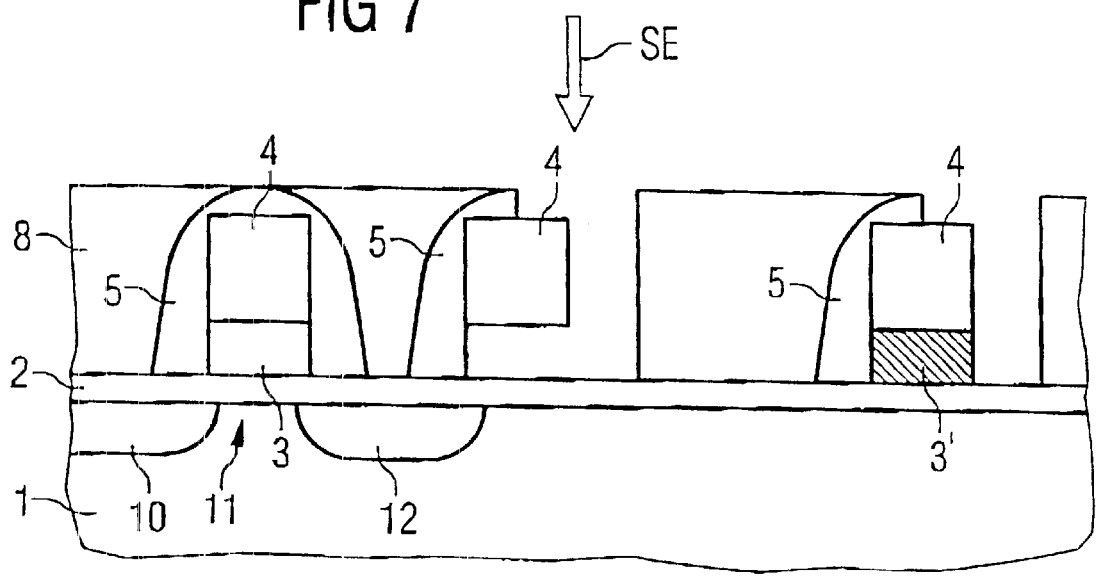
Figure 8:
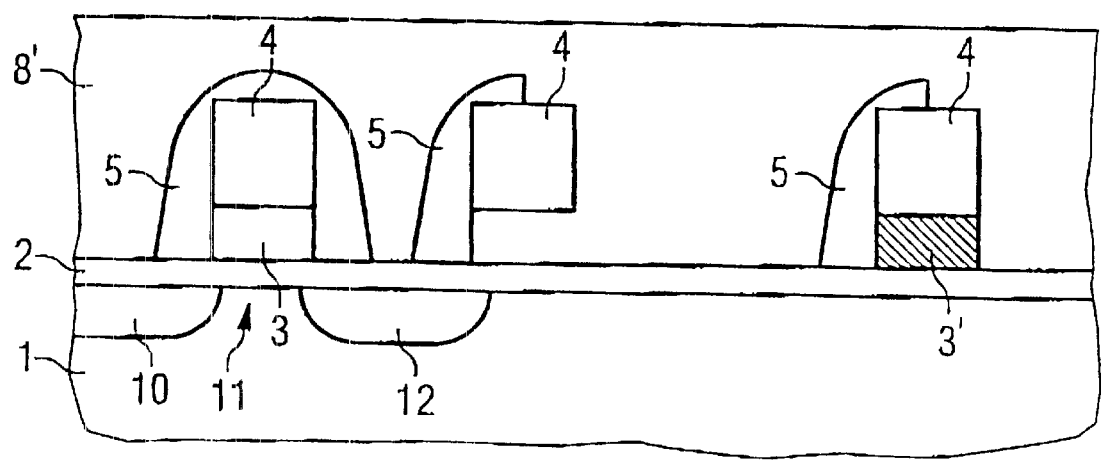
Figure 9:
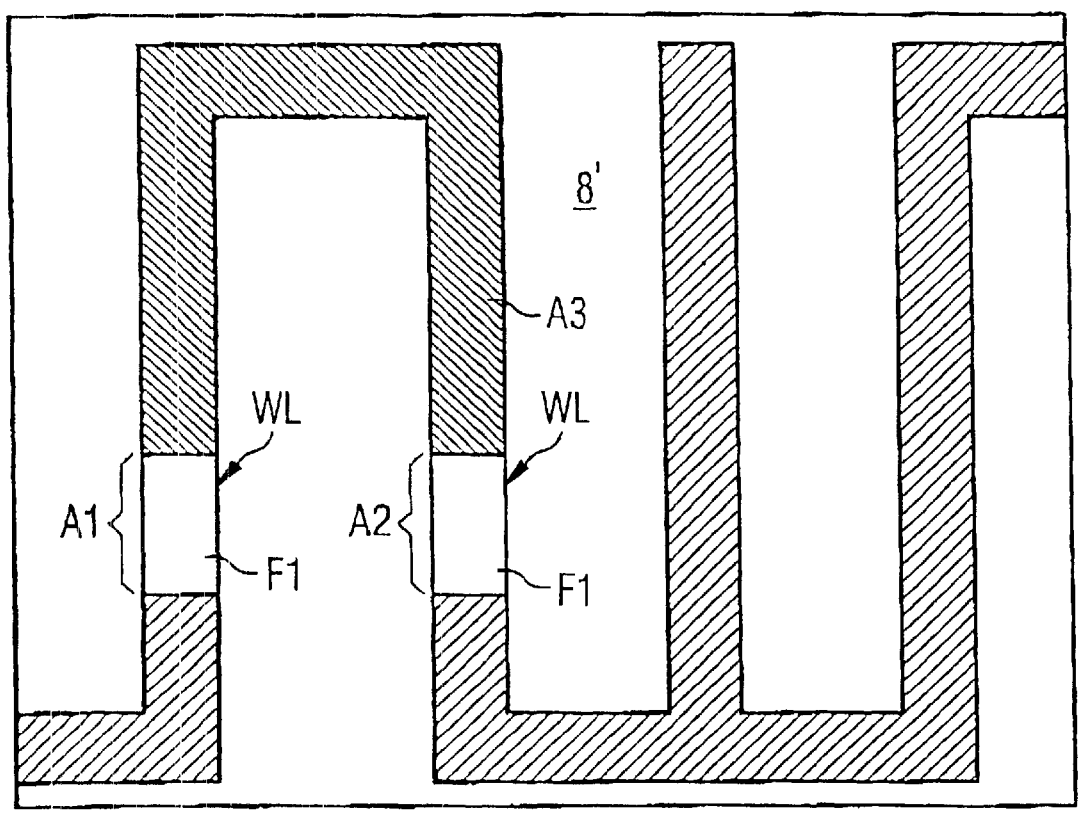

Then, as shown in FIG. 7, a selective etching step SE is carried out using KOH or a suitable dry-chemical plasma etching medium, by which the n-doped polysilicon of the lower layer 3 is attacked at the uncovered locations, but the lower region 3' of reversed doping is not attacked. As a result, the lower conductive layer 3 is completely removed at the locations which are defined by the second mask 9'. However, the etching operation stops at the areas A1 and A2, so that only the U-shaped section A3 of the word line WI is removed. This is illustrated in FIG. 9. After the said selective etching step, the resulting structure is then filled by further TEOS oxide deposition, which leads to the process state shown in FIG. 8.

Accordingly, in the finished state the word line WL in the U-shaped area is restricted to the upper conductive tungsten silicide layer 4, beneath which the TEOS filling 8' is located. In the other areas, by contrast, including the areas A1 and A2, the word line WL has the original two-layer structure.

Therefore, according to the present embodiment it is possible to accurately control the process involved in the undercut etching of the word line. A control feature of this type opens up new potential solutions for future semiconductor memory designs or other designs of integrated circuits.

In other words, additional degrees of freedom are provided for the design of the integrated circuits.

Although the present invention has been described above with reference to a preferred exemplary embodiment, it is not restricted to this embodiment, but rather can be modified in numerous ways.

In particular, the choice of layer materials is given purely by way of example and may be varied in numerous ways.

It should also be noted that the area A3 of the lower conductive polysilicon layer 3 of the word line WL does not have to be completely removed by the undercut etching, but rather may only be narrowed laterally, for example by means of a suitable second mask, in order, for example, in this way to provide a changed threshold voltage of the MOS transistors in this region.

Finally, it should be noted that the present invention is, of course, not restricted to semiconductor memory devices, but rather can in principle be applied to any type of integrated circuits.

What is claimed is:

1. Method for fabricating an integrated circuit, comprising the following steps:
   (a) preparing a substrate with an electrically insulating layer above it;
   (b) providing an interconnect having a lower conductive layer and an upper conductive layer on the insulating layer, the lower conductive layer consisting of silicon on a first conduction type;
   (c) embedding the interconnect in an electrically insulating structure;
   (d) at least partially uncovering a second section of the lower conductive layer of the interconnect of the first conduction type; and
   (e) removing the second section by means of an etching process; characterized by the steps of:
   (f) reversing the doping of at least one first section of the lower conductive layer of the interconnect to the second conduction type; and
   (g) selectively etching the second section of the lower conductive layer of the interconnect of the first conduction type by means of the etching process, with the first section acting as an etching stop.

2. Method according to claim 1, characterized in that the second section (A3) of the lower conductive layer (3) of the interconnect (WL) of the first conduction type (n) is completely removed.

3. Method according to claim 1, characterized in that the upper conductive layer consists of a metal silicide.

4. Method according to claim 1, characterized in that the electrically insulating structure has spacers of the interconnect and an electrically insulating layer.

5. Method according to claim 1, characterized in that the doping reversal comprises the following steps:
  (a) providing a first mask having an opening above the first section; and
  (b) carrying out ion implantation with ions of the second conduction type using the first mask.

6. Method according to claim 1, characterized in that the uncovering operation comprises the following steps:
  (a) providing a second mask having one or more openings above the second section; and
  (b) removing the electrically insulating structure by means of an etching step using the second mask.

7. Method according to claim 1, characterized in that the doping of two first sections, between which the second section is located, is reversed.

8. Method according to claim 1, characterized in that the interconnect is a word line of a semiconductor memory device.

9. Method according to claim 8, characterized in that two source/drain regions (10; 12), which are spaced apart from one another, of a select transistor are provided in the substrate (1), and the second section (A3) runs above the channel region (11) between these two source/drain regions.

10. Method according to claim 1, characterized in that the lower conductive layer consists of polysilicon.

11. Method according to claim 1, characterized in that the selective etching is carried out by wet-chemical means using KOH.

12. Method according to claim 1, characterized in that the second section is filled with an electrically insulating layer.

* * * * *